United States Patent
Seo et al.

(10) Patent No.: US 9,659,621 B2
(45) Date of Patent: May 23, 2017

(54) SEMICONDUCTOR MEMORY AND MEMORY SYSTEM INCLUDING THE SEMICONDUCTOR MEMORY

(71) Applicant: Samsung Electronics Co., Ltd., Suwon-si (KR)

(72) Inventors: Seong-Young Seo, Hwaseong-si (KR); Chul Woo Park, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 154 days.

(21) Appl. No.: 14/100,387

(22) Filed: Dec. 9, 2013

(65) Prior Publication Data

US 2014/0241099 A1     Aug. 28, 2014

(30) Foreign Application Priority Data

Feb. 26, 2013  (KR) .................. 10-2013-0020503

(51) Int. Cl.
| | |
|---|---|
| G06F 12/00 | (2006.01) |
| G11C 8/12 | (2006.01) |
| G11C 5/04 | (2006.01) |
| G11C 8/06 | (2006.01) |
| G06F 13/00 | (2006.01) |
| G06F 13/28 | (2006.01) |

(52) U.S. Cl.
CPC .................. *G11C 8/12* (2013.01); *G11C 5/04* (2013.01); *G11C 8/06* (2013.01)

(58) Field of Classification Search
CPC ................ G11C 8/12; G11C 5/04; G11C 8/06
USPC ......................................................... 711/104
See application file for complete search history.

(56) References Cited

U.S. PATENT DOCUMENTS

| | | | |
|---|---|---|---|
| 5,926,433 A | 7/1999 | McLaury | |
| 5,943,283 A * | 8/1999 | Wong .................. | G06F 12/1408 365/221 |
| 7,187,615 B2 | 3/2007 | Park et al. | |
| 7,493,467 B2 | 2/2009 | Gould | |
| 8,081,534 B2 | 12/2011 | Kim | |
| 8,145,869 B2 * | 3/2012 | Sargeant et al. .............. | 711/168 |
| 8,223,533 B2 | 7/2012 | Ozeki et al. | |
| 8,726,040 B2 * | 5/2014 | Dolgunov et al. ........... | 713/190 |
| 8,972,822 B2 * | 3/2015 | Nakano et al. ............... | 714/763 |
| 2004/0153620 A1 * | 8/2004 | Eisen et al. .................. | 711/202 |
| 2006/0095620 A1 * | 5/2006 | Dreps ................. | G06F 13/1684 710/100 |
| 2007/0280478 A1 * | 12/2007 | Verdun .................. | H04L 9/065 380/255 |

(Continued)

*Primary Examiner* — Mark Giardino, Jr.
(74) *Attorney, Agent, or Firm* — Muir Patent Law, PLLC

(57) ABSTRACT

A memory system is provided which includes multiple semiconductor memories having arrays of memory cells and a memory controller configured to provide an address in common to the multiple memories. First and second addresses corresponding to first and second rows of memory cells in first and second memories are selected according to the address in common. The first row and its adjacent rows in the first memory can all be different from the second row and its adjacent rows in the second semiconductor memory. Different conversion schemes can provide scramble information used to convert the address in common into the first and second addresses.

17 Claims, 18 Drawing Sheets

(56) References Cited

U.S. PATENT DOCUMENTS

2008/0040559 A1* 2/2008 Wolford ............. G06F 12/0844
  711/150
2008/0168214 A1   7/2008 Kwon et al.
2011/0185225 A1   7/2011 Tsuji
2012/0204079 A1   8/2012 Takefman et al.

* cited by examiner

Fig. 3

| Memory Chip (1101) | | Memory Chip (1102) | |
|---|---|---|---|
| WL | Row Address | WL | Row Address |
| 1 | 1 | 1 | 1 |
| 2 | 2 | 2 | 2 |
| 3 | 3 | 3 | 3 |
| 4 | 4 | 4 | 4 |
| 5 | 5 | 5 | 5 |
| 6 | 6 | 6 | 6 |
| 7 | 7 | 7 | 7 |
| 8 | 8 | 8 | 8 |
| 9 | 9 | 9 | 9 |
| 10 | 10 | 10 | 10 |

⋮

| Memory Chip (110n) | |
|---|---|
| WL | Row Address |
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 10 | 10 |

| | Memory Chip (110_1) | Memory Chip (110_2) | ... | Memory Chip (110_n) |
|---|---|---|---|---|
| Received Row Address | 4 | 4 | ... | 4 |
| Active WL (Agressor WL) | WL4 | WL4 | ... | WL4 |
| Victim WL | WL3 WL5 | WL3 WL5 | ... | WL3 WL5 |

Fig. 6

| Memory Chip | 1101 | 1102 | ... | 110n |
|---|---|---|---|---|
| SI | SI_1 | SI_2 | | SI_3 |

Fig. 7

| Memory Chip (1101) | | Memory Chip (1102) | | | Memory Chip (110n) | |
|---|---|---|---|---|---|---|
| Converted Row Address | Row Address | Row Address | Converted Row Address | | Row Address | Converted Row Address |
| 1 | 1 | 1 | 1 | | 1 | 1 |
| 2 | 2 | 2 | 3 | | 2 | 4 |
| 3 | 3 | 3 | 5 | | 3 | 7 |
| 4 | 4 | 4 | 7 | | 4 | 10 |
| 5 | 5 | 5 | 9 | | 5 | 2 |
| 6 | 6 | 6 | 2 | | 6 | 5 |
| 7 | 7 | 7 | 4 | | 7 | 8 |
| 8 | 8 | 8 | 6 | | 8 | 3 |
| 9 | 9 | 9 | 8 | | 9 | 6 |
| 10 | 10 | 10 | 10 | | 10 | 9 |

Fig. 8

|  | Memory Chip (1101) | Memory Chip (1102) | | Memory Chip (110n) |
|---|---|---|---|---|
| Received Row Address | 4 | 4 | ... | 4 |
| Converted Row Address | 4 | 7 | | 10 |
| Active WL (Agressor WL) | WL4 | WL7 | | WL10 |
| Victim WL | WL3 WL5 | WL6 WL8 | | WL9 |
| Request Row Address to acess victim WL | 3 5 | 8 9 | | 10 |

Fig. 9

| Converting Scheme | Scramble Information |
|---|---|
| Circular Shift | # of shifts of ADDR for each memory chip |
| Flip | Locations and # of bits of ADDR to be flipped for each memory chip |
| Randomize | Seed for each memory chip |
| Table Conversion | PDT |

| Memory Chip | 2101 | 2102 | ... | 210n | 2201 | 2202 | ... | 220n |
|---|---|---|---|---|---|---|---|---|
| | CH1 | | | | CH2 | | | |
| First SI | SI_1 | SI_2 | | SI_n | SI_1 | SI_2 | | SI_n |
| Second SI | SI_a | | | SI_a | SI_b | | | SI_b |
| | SI_a1 | SI_a2 | | SI_an | SI_b1 | SI_b2 | | SI_bn |
| Final SI | | | | | | | | |

Fig. 15

| Memory Chip | 4101_a | 4102_a | ... | 410n_a | 4101_b | 4102_b | ... | 410n_b |
|---|---|---|---|---|---|---|---|---|
| | Rank1 | | | | Rank2 | | | |
| | CH1 | | | | | | | |
| First SI | SI_a | SI_a | | SI_a | SI_a | SI_a | | SI_a |
| Second SI | SI_R1 | SI_R1 | | SI_R1 | SI_R2 | SI_R2 | | SI_R2 |
| Third SI | SI_1 | SI_2 | | SI_n | SI_1 | SI_2 | | SI_n |
| Final SI | SI_aR11 | SI_aR12 | | SI_aR1n | SI_aR21 | SI_aR22 | | SI_aR2n |

| Memory Chip | 4201_a | 4202_a | ... | 420n_a | 4201_b | 4202_b | ... | 420n_b |
|---|---|---|---|---|---|---|---|---|
| | Rank1 | | | | Rank2 | | | |
| | CH2 | | | | | | | |
| First SI | SI_b | SI_b | | SI_b | SI_b | SI_b | | SI_b |
| Second SI | SI_R1 | SI_R1 | | SI_R1 | SI_R2 | SI_R2 | | SI_R2 |
| Third SI | SI_1 | SI_2 | | SI_n | SI_1 | SI_2 | | SI_n |
| Final SI | SI_bR11 | SI_bR12 | | SI_bR1n | SI_bR21 | SI_bR22 | | SI_bR2n |

Fig. 19

| ADDR pin of memory controller | A1 | A2 | A3 |
|---|---|---|---|
| MC1 | A1 | A2 | A3 |
| MC2 | A1 | A3 | A2 |
| MC3 | A2 | A1 | A3 |
| MC4 | A2 | A3 | A1 |
| MC5 | A3 | A1 | A2 |
| MC6 | A3 | A2 | A1 |

SEMICONDUCTOR MEMORY AND MEMORY SYSTEM INCLUDING THE SEMICONDUCTOR MEMORY

CROSS-REFERENCE TO RELATED APPLICATIONS

This application claims priority under 35 U.S.C. §119 to Korean Patent Application No. 10-2013-0020503 filed Feb. 26, 2013, in the Korean Intellectual Property Office, the entire contents of which are hereby incorporated by reference.

BACKGROUND

The inventive disclosure described herein relates to a semiconductor memory and a memory system including the semiconductor memory.

A semiconductor memory device is a memory device which is fabricated using semiconductors such as silicon (Si), germanium (Ge), gallium arsenide (GaAs), indium phosphide (InP), and the like. Semiconductor memory devices are generally classified into volatile and nonvolatile memory devices.

Volatile memory devices may lose stored contents at power-off. Types of volatile memory devices include static RAM (SRAM), dynamic RAM (DRAM), synchronous DRAM (SDRAM), and the like. Nonvolatile memory devices may retain stored contents even at power-off. Types of nonvolatile memory devices include read only memory (ROM), programmable ROM (PROM), electrically programmable ROM (EPROM), electrically erasable and programmable ROM (EEPROM), flash memory devices, phase-change RAM (PRAM), magnetic RAM (MRAM), resistive RAM (RRAM), ferroelectric RAM (FRAM), and the like.

As semiconductor fabricating processes have developed, semiconductor devices may be scaled down. In particular, semiconductor memory cells may be scaled down. Scaling down of semiconductor memory cells may result in various phenomena negatively affecting the device. For example, phenomena associated with scaling down semiconductor memory cells may cause destruction of data stored therein. This may lower the reliability of a semiconductor memory. Thus, there are benefits to providing improved semiconductor memory devices and memory systems that include semiconductor memory that reduce problems associated with such phenomena.

SUMMARY

One aspect of embodiments of the inventive concept is directed to provide a memory system, comprising first and second semiconductor memories each including a plurality of memory cells disposed along rows and columns. Rows in the first memory have corresponding rows in the second memory, and the memories may have the same structure. A memory controller is configured to control the first and second semiconductor memories, wherein the first and second semiconductor memories are configured to receive an address in common from the memory controller. Circuitry is included to access, based on the common address, different rows in the first and second memories. The address of a row accessed in one of the memories is different from the address of the row in that memory corresponding to the row accessed in the other memory.

In various embodiments, first addresses corresponding to first rows adjacent to a row of memory cells of the first semiconductor memory selected according to the address received in common are different from second addresses corresponding to second rows adjacent to a row of memory cells of the second semiconductor memory selected according to the address received in common.

In example embodiments, a first address of a first row in the first memory and a second address of a second row of a second memory are transferred from the memory controller to the first and second semiconductor memories. The rows adjacent the accessed row in the first memory do not correspond to rows adjacent the accessed row in the second memory.

In example embodiments, the first and second semiconductor memories convert the address received in common to different conversion addresses to access memory cells according to the respective converted addresses.

In example embodiments, each of the first and second semiconductor memories comprises an address buffer configured to store the address received in common. A program circuit is configured to provide scramble information. An address converter is configured to convert an address stored in the address buffer to a conversion address according to the scramble information from the program circuit.

In example embodiments, scramble conversion information is different for the first and second semiconductor memories.

In example embodiments, the program circuit includes a fuse circuit or a mode register.

In example embodiments, the memory controller writes scramble information at the first and second semiconductor memories at power-on.

In example embodiments, the memory system further comprises third and fourth semiconductor memories, each including a plurality of memory cells disposed along rows and columns. Rows in the third memory have corresponding rows in the fourth memory, and the memories may have the same structure. Here, the third and fourth semiconductor memories are also configured to receive an address in common from the memory controller. Circuitry is configured to access, based on the common address, a third row having a third address in the third memory and a fourth row having a fourth address in the fourth memory. Here, the third address accesses a third row in the third memory that is not the corresponding row accessed in the fourth memory using the fourth address.

In example embodiments, the first to fourth semiconductor memories are configured to receive an address in common from the memory controller, and based on converting the common address, different first to fourth addresses are used to access different rows in the first to fourth memories.

In example embodiments, the first and second semiconductor memories form a first memory module communicating with the memory controller through a first channel and the third and fourth semiconductor memories form a second memory module communicating with the memory controller through a second channel.

In example embodiments, the first and second semiconductor memories form a first rank and the third and fourth semiconductor memories form a second rank. The first and third semiconductor memories communicate with the memory controller in common through first data lines, and the second and fourth semiconductor memories communicate with the memory controller in common through second data lines.

In example embodiments, the memory system further comprises a register block configured to receive the address from the memory controller and to transfer the received address to the first and second semiconductor memories. Here, the register block is further configured to write or transfer scramble information to the first and second semiconductor memories at power-on.

In example embodiments, a first address node of the memory controller is connected to first and second address nodes, being different from each other, of the first and second semiconductor memories, respectively.

Another aspect of embodiments of the inventive concept is directed to provide a semiconductor memory that includes a plurality of memory cells disposed along rows and columns. An address buffer is configured to store an input address. A program circuit is configured to store scramble information. An address converter coupled to the address buffer is configured to convert an address in the address buffer to a conversion address according to the scramble information stored in the program circuit. A row decoder coupled to the address converter is configured to access rows of the memory cells based on the conversion address.

In example embodiments, the program circuit is a mode register or a fuse circuit. The scramble information may comprise circular shift, flip, randomize or table conversion information.

In still other embodiments of the inventive concept, a computing apparatus is provided that includes a processor, a memory controller coupled to the processor, and a plurality of memories including at least first and second memories coupled to the memory controller. Each memory includes a plurality of memory cells disposed along rows and columns. Each row in the first plurality of memory cells has a corresponding row in the second plurality of memory cells. The computing apparatus is configured to convert a common input address into first and second addresses for accessing first and second rows in the first and second memories. The row accessed in the first memory using the first address does not correspond to the row accessed in the second memory using the second address and does not correspond to rows in the second memory adjacent the row accessed in the second memory. Various scramble information may be used to convert the common input address. Additional similar memories such as third and fourth memories may be provided that also are accessed using addresses converted from the common address. The row accessed in the third memory may not correspond to either the first and second rows accessed in the first and second memories or to the rows adjacent the accessed rows in the first and second memories.

With embodiments of the inventive concept, semiconductor memories may select memory cells placed at different locations in response to an address received in common from a memory controller. In the semiconductor memories, different rows may be activated, and adjacent word lines suffering a stress from the activated rows may be different. Thus, embodiments can improve performance and reliability by, for example, preventing a burst error from being generated.

BRIEF DESCRIPTION OF THE FIGURES

The above and other objects and features will become apparent from the following description with reference to the following figures, wherein like reference numerals refer to like parts throughout the various figures unless otherwise specified, and wherein:

FIG. 3 is a table schematically illustrating addresses allocated to word lines of memory chips;

FIG. 6 is a table schematically illustrating memory chips and corresponding scramble information;

FIG. 7 is a table schematically illustrating addresses and converted addresses of memory chips;

FIG. 8 is a table schematically illustrating activated word lines and word lines suffering a stress from the activated word lines according to an embodiment;

FIG. 9 is a table identifying scramble information for different converting schemes for use in various embodiments;

FIG. 12 is a table schematically illustrating an embodiment of memory chips and associated scramble information corresponding to FIG. 11;

FIG. 15 is a table schematically illustrating an embodiment of memory chips and associated scramble information corresponding to FIG. 14;

FIG. 19 is a table schematically illustrating an embodiment of an address line scrambling method.

DETAILED DESCRIPTION

Figure 1:
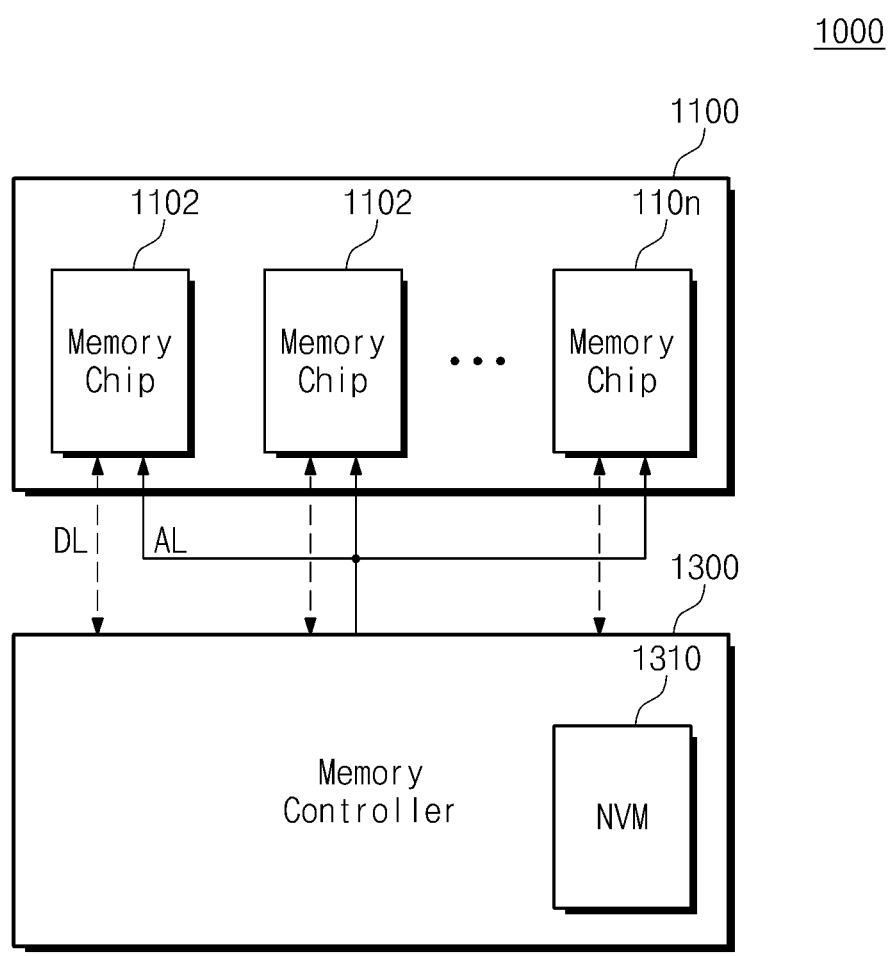
FIG. 1 is a block diagram schematically illustrating an exemplary memory system for implementing embodiments of the invention.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the inventions to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated.

It will be understood that, although the terms "first", "second", "third", etc., may be used herein to describe various elements, components, and/or sections, these elements, components, and/or sections should not be limited by these terms. These terms are only used to distinguish one element, component, or section from another. Thus, a first element, component, or section discussed below could be termed a second element, component, or section without departing from the teachings of the inventive concept.

The terminology used herein is for the purpose of describing particular embodiments only and is not intended to be limiting of the inventions as claimed. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element is referred to as being "on", "connected to", "coupled to", or "adjacent to" another element, it can be directly on, connected, coupled, or adjacent to the other element, or intervening elements may be present. In contrast, when an element is referred to as being "directly on," "directly connected to", "directly coupled to", or "immediately adjacent to" another element, there are no intervening elements present.

Unless otherwise defined, all terms (including technical and scientific terms) used herein have the same meaning as commonly understood by one of ordinary skill in the art to which the inventions herein belong. It will be further understood that terms, such as those defined in commonly used dictionaries, should be interpreted as having a meaning that is consistent with their meaning in the context of the relevant art and/or the present specification and will not be interpreted in an idealized or overly formal or limited sense unless expressly so defined herein.

FIG. 1 is a block diagram schematically illustrating a memory system 1000 according to an embodiment of the inventive concept. Referring to FIG. 1, a memory system 1000 may include a semiconductor memory device 1100 and a memory controller 1300.

The semiconductor memory device 1100 may include a plurality of memory chips 1101 to 110n, which typically all have the same structure for an array of memory cells arranged in rows and columns. The memory chips 1101 to 110n may operate in response to a control of the memory controller 1300. The memory chips 1101 to 110n may exchange data with the memory controller 1300 through different data lines DL. The memory chips 1101 to 110n may receive an address from the memory controller 1300 through a common address line AL.

In example embodiments, the memory chips 1101 to 110n may be DRAM chips. While below it is generally assumed that the memory chips 1101 to 110n are DRAM chips, the inventive concept applies to other memories such as static RAM, synchronous DRAM, read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), or the like.

Components of memory system 1000 may be configured in various physical packages or embodiments within one or more chips, packages, modules, etc. The semiconductor memory device 110 may form a memory module. The semiconductor memory device 110 may be integrated in a package to form a multi-chip package. The semiconductor memory device 110 and the memory controller 1300 may be integrated in a package to form a multi-chip package. The semiconductor memory device 110 and the memory controller 1300 may form independent packages to form a package-in-package.

The memory controller 1300 may be configured to control the semiconductor memory device 1100. The memory controller 1300 may control read and write operations of the semiconductor memory device 1100. The memory controller 1300 may include a nonvolatile memory 1310.

The nonvolatile memory 1310 may include one of various nonvolatile memories such as a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), or the like. The nonvolatile memory 1310 may store various information needed for an operation of the semiconductor memory device 1100. For example, the nonvolatile memory 1310 may store information for setting mode registers of the memory chips 1101 to 110n of the semiconductor memory device 1100. For example, the nonvolatile memory 1310 may store information such as CAS latency, RAS latency, an additive latency, a burst length, and so on.

At power-on, the memory controller may send information stored in the nonvolatile memory 1310 to the memory chips 1101 to 110n in order to program them.

The memory chips 1101 to 110n receive an address from the memory controller 1300 in common. In response to the received common address, the memory chips 1101 to 110n may access memory cells placed at different locations. For example, in response to the received address in common, the memory chips 1101 to 110n may access different rows of memory cells.

Figure 2:
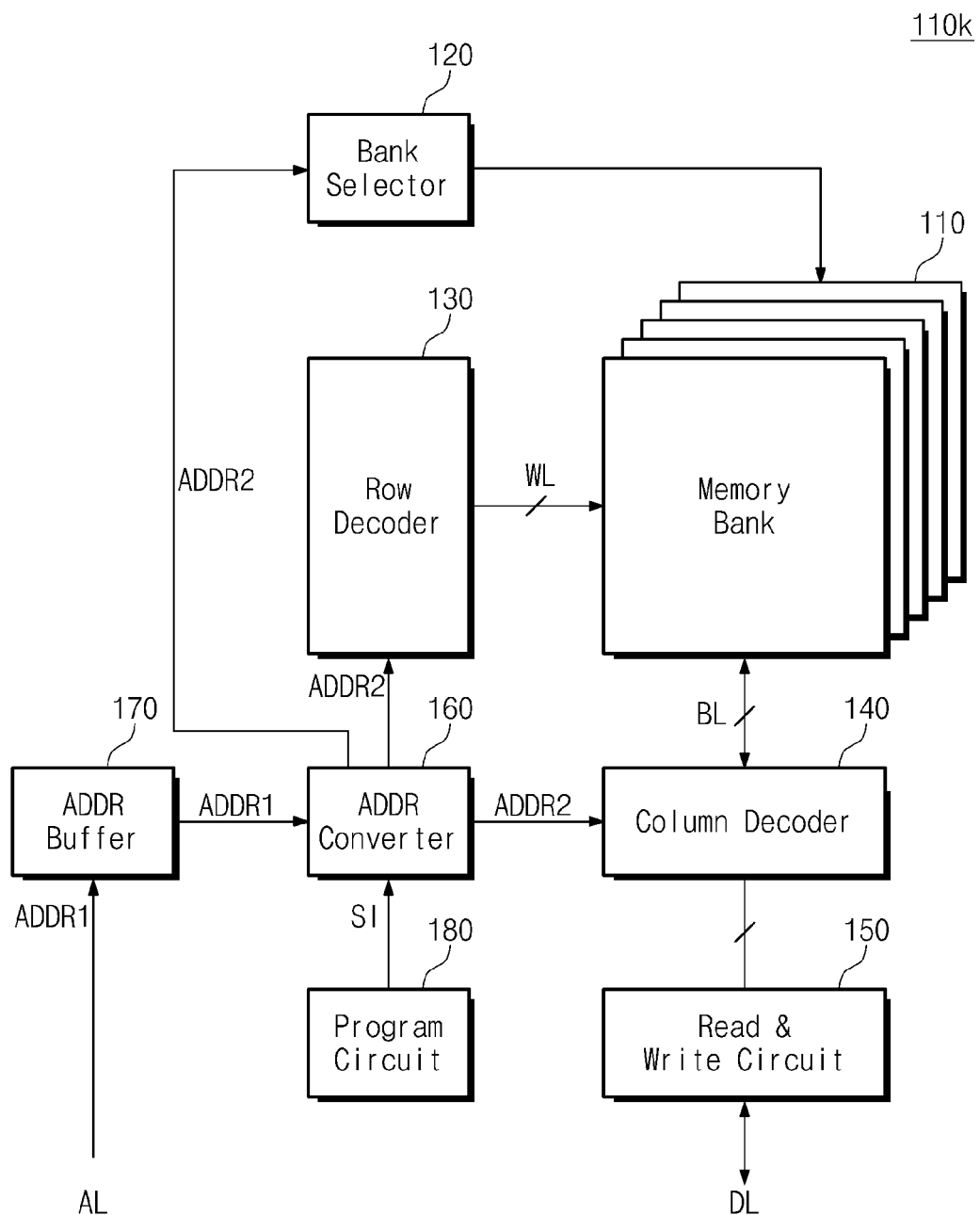
FIG. 2 is a block diagram schematically illustrating a memory chip for implementing embodiments of the invention.

FIG. 2 is a block diagram schematically illustrating a memory chip 110k according to an embodiment of the inventive concept. Referring to FIGS. 1 and 2, a memory chip 110k may include a memory cell array 110, a bank selector 120, a row decoder 130, a column decoder 140, a read/write circuit 150, an address converter 160, an address buffer 170, and a program circuit 180.

The memory cell array 110 may include a number of memory banks, each of which has a plurality of memory cells arranged along rows and columns. Rows of memory cells may be connected to word lines. Columns of memory cells may be connected to bit lines. The number of memory banks in memory cell array 110 can vary according to the requirements of any particular application or implementation of an embodiment of the invention.

The bank selector 120 may be configured to select one of the memory banks of the memory cell array 110. The bank selector 120 may select a memory bank according to an address ADDR2 received from the address converter 160.

The row decoder 130 is connected to the memory cell array 110 through the word lines. The row decoder 130 may be configured to select word lines according to the address ADDR2 provided from the address converter 160. That is, the row decoder 130 may select rows of memory cells in response to the address ADDR2. The row decoder 130 may select rows of memory cells in a memory bank selected by the bank selector 120.

The column decoder 140 is connected to the memory cell array 110 through the bit lines. The column decoder 140 may be configured to select bit lines according to an address ADDR2 provided from the address converter 160. That is the column decoder 140 may select columns of memory cells according to the address ADDR2. The column decoder 140 may select columns of memory cells of a memory bank selected by the bank selector 120.

The read/write circuit 150 is connected to the column decoder 140. The read/write circuit 150 may access bit lines selected by the column decoder 140. The read/write circuit 150 may perform read and write operations on memory cells connected to bit lines selected by the column decoder 140. The read/write circuit 150 may include a sense amplifier and a write driver.

The address converter 160 may receive an address ADDR1 from the address buffer 170 and scramble information SI from the program circuit 180 and convert the address ADDR1 to the address ADDR2 based on the scramble information SI. The address converter 160 may make the conversion in response to a RAS signal.

The address converter 160 provides the address ADDR2 converted to the bank selector 120, the row decoder 130, and the column decoder 140. The address converter 160 may not make any conversion with respect to a column address ADDR2 provided to the column decoder 140, for example by skipping the address converting operation in response to a CAS signal.

The address buffer 170 may receive the address ADDR1 from a memory controller 1300 through an address line AL. The address buffer 170 may store the address ADDR1 received and output it to the address converter 160.

The program circuit 180 may store and/or be programmed to generate the scramble information SI. The program circuit 180 may be a fuse circuit (e.g., a laser fuse circuit or an electrical fuse circuit) or a mode register. In the event that the program circuit 180 is a mode register, scramble information SI of memory chips 1101 to 110n may be stored at a nonvolatile memory 1310 or otherwise generated in the memory controller 1300. The memory controller 1300 may program the scramble information SI into program circuits of the memory chips 1101 to 110n. In the event that the program circuit 180 is a fuse circuit, the scramble information SI may be programmed in the program circuit 180 by a test apparatus or the memory controller 1300.

The scramble information SI may include information associated with the relationship between row addresses received from the memory controller 1300 and row addresses used in the memory chip 110k. For example, the scramble information SI may be a table including address mapping information. The scramble information SI may include information associated with a rule of converting addresses. The memory system 1000 may use the scramble information SI to convert an address received in common from the memory controller 1300, which may be considered a logical address, into an address used to access a particular memory location in a memory chip 110l to 110n, which may be considered a physical address.

FIG. 3 is a table showing general allocation of addresses to word lines of memory chips 1101 to 110n. Referring to FIGS. 1 to 3, first to tenth row addresses may be allocated to first to tenth word lines WL1 to WL10 of memory chips 1101 to 110n. In other words, in this example, the same row addresses may be allocated to word lines having the same location in memory chips 1101 to 110n.

In FIG. 3, there are illustrated ten word lines WL1 to WL10 and ten row addresses for ease of description. However, the number of word lines and the number of row addresses can vary.

Figures 4, 5:
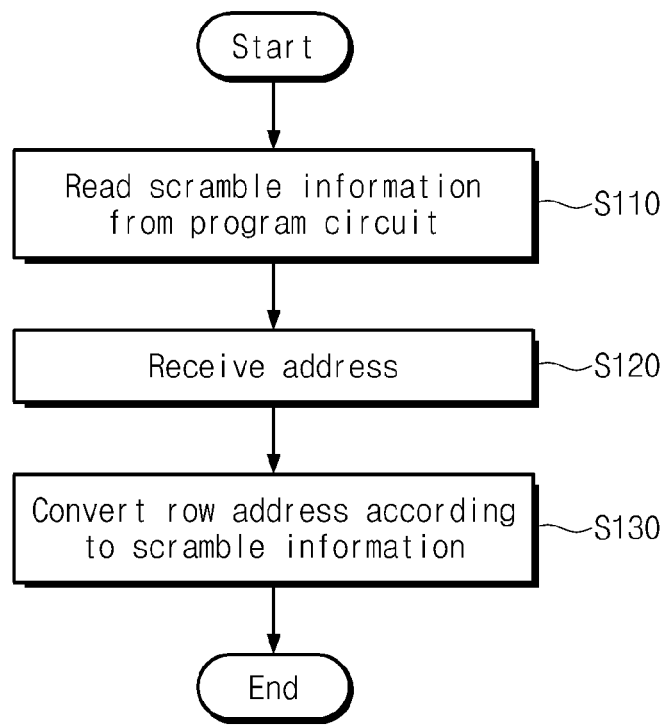
FIG. 4 is a table schematically illustrating an activated word line and word lines suffering a stress from the activated word line.
FIG. 5 is a flow chart schematically illustrating an embodiment for an operating method of a memory chip.

FIG. 4 is a table schematically illustrating an activated word line and word lines suffering stress from the activated word line. Referring to FIGS. 3 and 4, a row address of "4" may be sent in common to memory chips 1101 to 110n. In response to the row address, fourth word lines WL4 in the respective memory chips 1101 to 110n may be activated in common.

The third and fifth word lines WL3 and WL5 adjacent to the fourth word line WL4 may suffer stress from activation of the fourth word line WL4. For example, the third and fifth word lines WL3 and WL5 may suffer stress from row hammer or field penetration. The activated fourth word line WL4 may be considered an aggressor word line, and the adjacent third and fifth word lines WL3 and WL5 may be considered victim word lines. Especially if the fourth word line WL4 is iteratively activated, memory cells connected with the third and fifth word lines WL3 and WL5 may lose data stored therein due to accumulated stress.

At least one of the memory chips 1101 to 110n may store information for error correction such as parity bits. If error correction is performed, error included in data stored at the memory chips 1101 to 110n may be corrected. However, error correction has limitations. For example, the number of error bits correctable through error correction may be limited.

The memory chips 1101 to 110n may receive an address in common through an address line AL. When the fourth word line WL4 is iteratively accessed, memory cells connected to the third and fifth word lines WL3 and WL5 of the memory chips 1101 to 110n may experience a stress in common. Thus, data stored at memory cells connected to the third and fifth word lines WL3 and WL5 of the memory chips 1101 to 110n may be lost. When a read operation is performed with respect to the third or fifth word lines of the memory chips 1101 to 110n, data bits output from the memory chips 1101 to 110n may include errors. While error correction techniques can mitigate this, the number of bits with errors in the memory chips 1101 to 110n may exceed the error correction range.

To address the above-described problem, the memory chips 1101 to 110n according to an embodiment of the inventive concept may convert an address ADDR1 received from a memory controller 1300 to an address ADDR2 using scramble information SI. The memory chips 1101 to 110n may access memory cells using the converted address ADDR2. Scramble information SI may be different for each of the memory chips 1101 to 110n. For example, when rows (or, word lines) of memory cells of the memory chips 1101 to 110n are selected by the same address ADDR1, the scramble information SI may be set such that addresses of victim word lines in each of the memory chips 1101 to 110n are different. Thus, although the same address ADDR1 is iteratively sent to the memory chips 1101 to 110n, it is possible to prevent stress from being accumulated at all the memory cells corresponding to the same address (e.g., a row address).

FIG. 5 is a flow chart schematically illustrating an operating method of a memory chip 110k according to an embodiment of the inventive concept. Referring to FIGS. 2 and 5, in operation S110, scramble information SI may be read from a program circuit 180.

In operation S120, an address ADDR1 may be received from an external device.

In operation S130, the address ADDR1 may be converted to an address ADDR2 according to the scramble information SI. For example, a row address of the address ADDR1 received may be converted.

Figure 6:
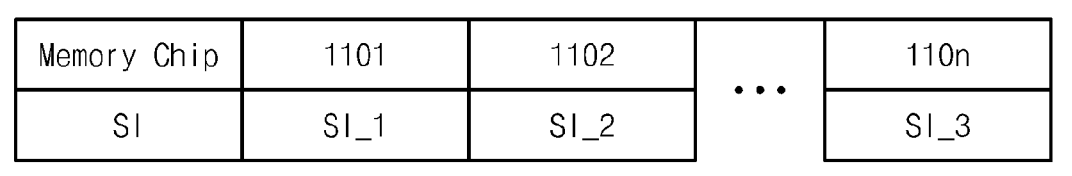

FIG. 6 is a table schematically illustrating memory chips 1101 to 110n and scramble information SI corresponding thereto. Referring to FIGS. 1 and 6, scramble information SI_1 to SI_n may be assigned to memory chips 1101 to 110n, respectively. The scramble information SI_1 to SI_n may be different from one another. The scramble information SI_1 to SI_n may include or be based on different address conversion tables or different address conversion rules. When rows (or, word lines) of memory cells of the memory chips 1101 to 110n are selected by the same address ADDR1, the scramble information SI may be set such that addresses of victim word lines in the memory chips 1101 to 110n are different.

FIG. 7 is a table illustrating an embodiment in which selected addresses are converted for memory chips 1101 to 110n. In FIG. 7, there are exemplarily illustrated row addresses (transferred in common from a memory controller 1300) and converted row addresses of memory chips 1101 to 110n.

Referring to FIGS. 1, 2, and 7, a memory chip 1101 may not convert a row address transferred from the memory controller 1300. Scramble information SI of the memory chip 1101 may include information on no conversion or scrambling for that memory chip may otherwise be avoided so that a converted address of the memory chip 1101 may be equal to an address transferred from the memory controller 1300.

In this embodiment, memory chips 1102 to 110n convert row addresses transferred from the memory controller 1300 according to scramble information SI.

FIG. 8 is a table that illustrates an activated word line and word lines suffering stress from the activated word line according to the embodiment of FIG. 7. Referring to FIGS. 3, 7 and 8, a row address of "4" may be sent in common to memory chips 1101 to 110n. A memory chip 1101 may convert a row address of "4" to a row address of "4". In response to the converted row address, a fourth word line WL4 in the memory chip 1101 may be activated. When the fourth word line WL4 is activated, third and fifth word lines WL3 and WL5 adjacent to the fourth word line WL4 may suffer stress from the fourth word line WL4.

In this example, for the memory chip 1101, an input address and a converted address are equal to each other. Thus, addresses of "3" and "5" are used to access word lines WL3 and WL5.

The memory chip 1102 converts the row address of "4" to a row address of "7". In response to the converted row address of "7", a seventh word line WL7 in the memory chip 1102 is activated. When the seventh word line WL7 is activated, sixth and eighth word lines WL6 and WL8 adjacent to the seventh word line WL7 may suffer a stress.

In the memory chip 1102, the sixth word line WL6 may be accessed using a converted row address of "6". In the memory chip 1102, an address of "8" is converted to a row address of "6". Thus, an address of "8" is required to access the sixth word line WL6.

Likewise, in the memory chip 1102, the eighth word line WL8 is accessed using a converted row address of "8". In the memory chip 1102, an address of "9" is converted to a row address of "8". Thus, an address of "9" is required to access the eighth word line WL8.

The memory chip 110n converts a row address of "4" to a row address of "10". In response to the converted row address of "10", the tenth word line WL10 in the memory chip 110n is activated. When the tenth word line WL10 is activated, the ninth word line WL9 adjacent to the tenth word line WL10 may suffer stress.

In the memory chip 110n, the ninth word line WL9 may be accessed according to a converted row address of "9". In the memory chip 110n, an address of "10" is converted to a row address of "9". Thus, an address of "10" is required to access the ninth word line WL9.

As described above for this example of the controller 1300 providing an address of "4" in common to memory chips 1101 to 110n, rows (or, word lines) of the memory chip 1101 experiencing stress correspond to addresses of "3" and "5" transferred from the memory controller 1300. Rows (or, word lines) of the memory chip 1102 experiencing stress correspond to addresses of "8" and "9" transferred from the memory controller 1300. A row (or, word line) of the memory chip 110n experiencing stress corresponds to an address of "10" transferred from the memory controller 1300.

Thus, when the memory controller 1300 sends a row address of "4" to the memory chips 1101 to 110n, rows of memory cells corresponding to addresses of "3" and "5" may suffer stress, rows of memory cells corresponding to addresses of "8" and "9" may suffer stress, and a row of memory cells corresponding to an address of "10" may suffer stress. When the memory controller 1300 accesses specific addresses of the memory chips 1101 to 110n, addresses associated with memory cells of the memory chips 1101 to 110n experiencing stress may be different. Thus, embodiments such as the foregoing prevent all data bits output from the memory chips 1101 to 110n according to an address transferred from the memory controller 1300 from becoming error bits due to stress, improving the performance and reliability of a memory system 1000.

FIG. 9 is a table illustrating various address conversion schemes and scramble information SI. Referring to FIG. 9, an address conversion scheme may include circular shift, flip, randomize, table conversion, and so on.

In a circular shift scheme, a row address may be circularly shifted by a predetermined number of bits. Scramble information SI may include information on the number of bits of a row address to be circularly shifted.

In a flip scheme, bits of a row addresses placed at predetermined locations may be inverted. The scramble information may include information the number and locations of bits to be inverted.

In a randomize scheme, a new address may be generated through combination of a row address and a seed, which an address converter 180 may use to generate a converted address. The scramble information SI may include information on a seed.

In a table conversion scheme, an address may be converted using a predetermined table PDT. The scramble information SI may include the predetermined table PDT.

Figure 10:
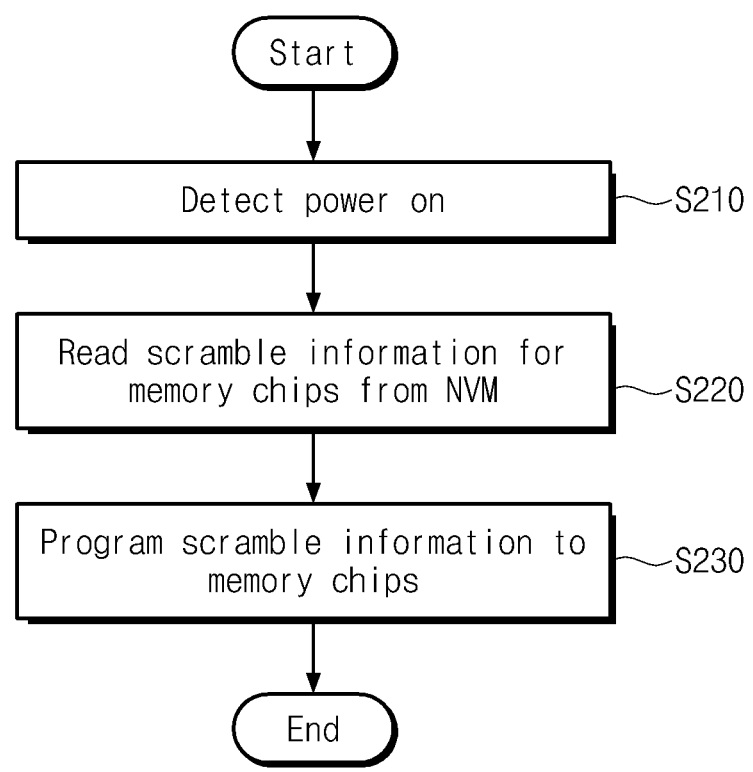
FIG. 10 is a flow chart schematically illustrating an embodiment of an operating method of a memory controller.

FIG. 10 is a flow chart schematically illustrating an operating method of a memory controller 1300 according to an embodiment of the inventive concept. In FIG. 10, there is illustrated an example where a memory controller 1300 programs or transfers scramble information SI stored in a nonvolatile memory 1310 into memory chips 1101 to 110n.

Referring to FIGS. 1 and 10, in step S210, memory controller 1300 detects whether power is supplied. In step S220, memory controller 1300 reads scramble information SI for memory chips 1101 to 110n from nonvolatile memory 1310. In step S230, memory controller 1300 programs or transfers scramble information SI into memory chips 1101 to 110n. In some embodiments, steps S220 and S230 may be executed at a reset operation of a memory system 1000.

Figure 11:
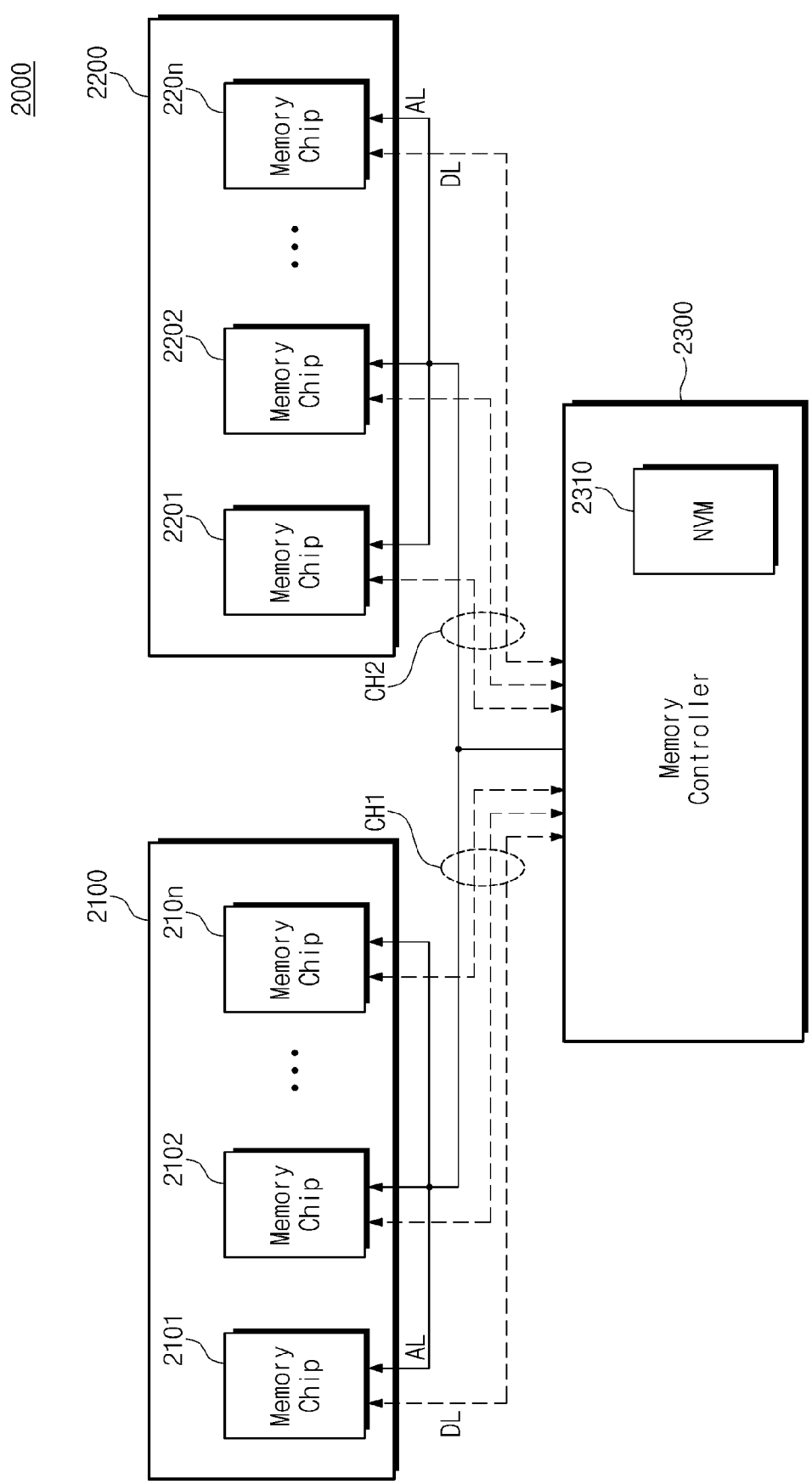
FIG. 11 is a block diagram schematically illustrating aspects of another embodiment of a memory system.

FIG. 11 is a block diagram illustrating a memory system 2000 according to another embodiment of the inventive concept. Referring to FIG. 11, a memory system 2000 may include first and second semiconductor memory devices 2100 and 2200 and a memory controller 2300.

The first semiconductor memory device 2100 may include first memory chips 2101 to 210n, each of which communicates with the memory controller 2300 through a separate data line DL and through a common address line AL.

The second semiconductor memory device 2200 may include second memory chips 2201 to 220n, each of which communicates with the memory controller 2300 through a separate data line DL and through the common address line AL.

The data lines DL and the address line AL between the first memory chips 2101 to 210n and the memory controller 2300 may form a first channel CH1. The data lines DL and the address line AL between the second memory chips 2201 to 220n and the memory controller 2300 may form a second channel CH2. Thus, the memory system 2000 may be a multi-channel memory system.

The first memory chips 2101 to 210n and the second memory chips 2201 to 220n receive an address in common from the memory controller 2300.

The memory controller 2300 is configured to control the first and second semiconductor memory devices 2100 and 2200. In this embodiment the memory controller 2300 includes a nonvolatile memory 2310. The nonvolatile memory 2310 may store various information needed for an operation of the first and second semiconductor memory devices 2100 and 2200.

Each of the first memory chips 2101 to 210n and the second memory chips 2201 to 220n may convert an address received from the memory controller 2300 and operate based on the converted address. Each of the first memory chips 2101 to 210n and the second memory chips 2201 to 220n may make address conversions such that an address of a row of memory cells activated according to an address received in common from the memory controller 2300 is different from activated row addresses in the other of the first and second memory chips 2101 to 210n and 2201 to 220n.

The first semiconductor memory device 2100 may form a memory module. The first semiconductor memory device 2100 may be integrated in a package to form a multi-chip package. The second semiconductor memory device 2200 may form a memory module. The second semiconductor memory device 2200 may be integrated in a package to form a multi-chip package. The first and second semiconductor memory devices 2100 and 2200 may be integrated in a package to form a multi-chip package.

The first and second semiconductor memory devices 2100 and 2200 and the memory controller 2300 may be integrated in a package to form a chip-on-chip package. The first and second semiconductor memory devices 2100 and 2200 and the memory controller 2300 may form separate packages to form a package-on-package.

FIG. 12 is a table schematically illustrating memory chips 2101 to 210n and 2201 to 220n and corresponding scramble information SI. Referring to FIGS. 11 and 12, first scramble information SI_a may be allocated to memory chips 2101 to 210n, and first scramble information SI_b may be allocated to memory chips 2201 to 220n. Different scramble information SI_a and SI_b may be allocated to the memory chips 2101 to 210n and 2201 to 220n according to the channel; the first scramble information SI_a and SI_b may be different from each other.

Second scramble information SI_1 to SI_n may be allocated to the memory chips 2101 to 210n, respectively. Second scramble information SI_1 and SI_2 may be allocated to the memory chips 2201 to 220n. The second scramble information SI_1 to SI_n may be different from one another. Addresses may be converted for each of the memory chips 2101 to 210n and 2201 to 220n through a combination of the first and second scramble information allocated thereto.

For example, the memory chips 2101 to 210n may combine the first scramble information SI_a and the second scramble information SI_1 to SI_n to generate scramble information SI_a1 to SI_an as well as the first scramble information SI_b and the second scramble information SI_1 to SI_n to generate scramble information SI_b1 to SI_bn as indicated in FIG. 12. The scramble information SI_a1 to SI_an and SI_b1 to SI_bn may include different address conversion tables or different address conversion rules. When rows of memory cells in the memory chips 2101 to 210n and 2201 to 220n are selected by the same address ADDR1, the scramble Information SI_a1 to SI_an and SI_b1 to SI_bn may be set such that addresses of victim word lines in the memory chips 2101 to 210n and 2201 to 220n are different from one another.

Figure 13:
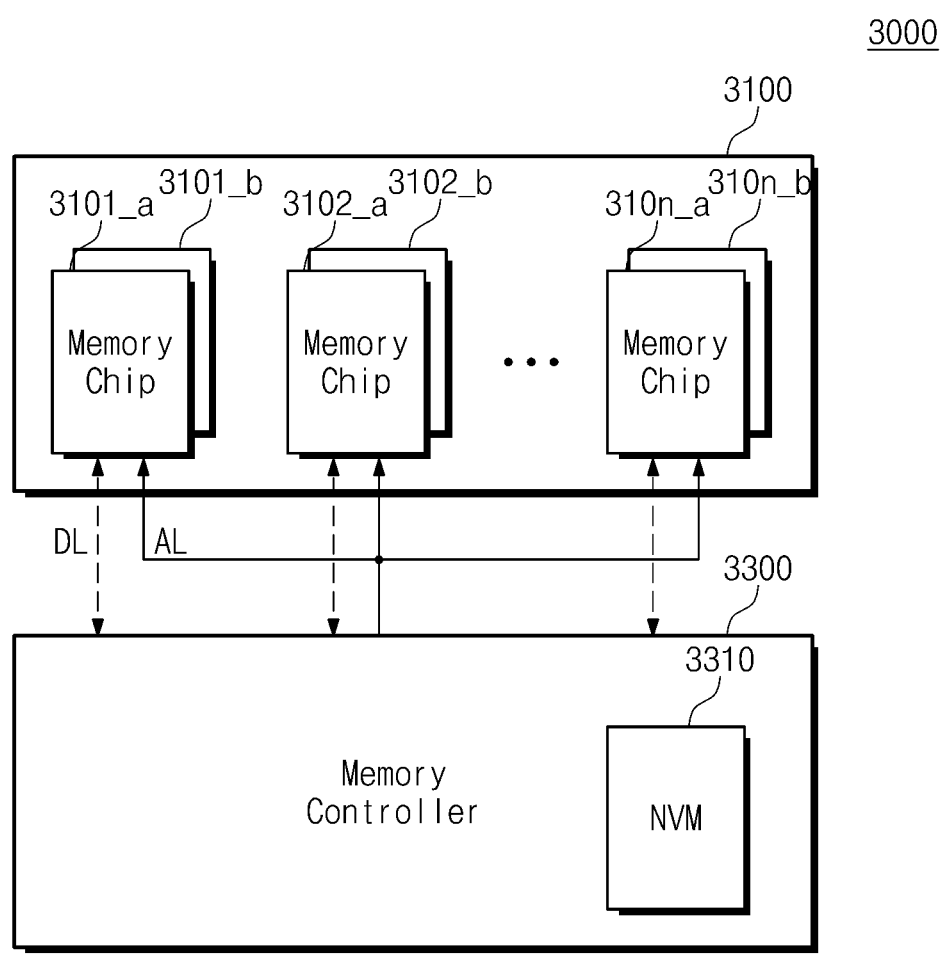
FIG. 13 is a block diagram schematically illustrating aspects of still another embodiment of a memory system.

FIG. 13 is a block diagram schematically illustrating a memory system 3000 according to still another embodiment of the inventive concept.

Referring to FIG. 13, a memory system 3000 may include a semiconductor memory device 3100 and a memory controller 3300.

The semiconductor memory device 3100 may include first memory chips 3101_a to 310n_a and second memory chips 3101_b to 310n_b.

Each of the first memory chips 3101_a to 310n_a may communicate with the memory controller 3300 through a separate data line DL. The first memory chips 3101_a to 310n_a may communicate with the memory controller 3300 through a common address line AL.

Each of the second memory chips 3101_b to 310n_b may communicate with the memory controller 3300 through a separate data line DL. The second memory chips 3101_b to 310n_b may communicate with the memory controller 3300 through the common address line AL.

The first memory chips 3101_a to 310n_a may form a first rank, and the second memory chips 3101_b to 310n_b may form a second rank. A first memory chip 310k_a may share the data line DL and the address line AL with a second memory chip 310k_b corresponding thereto.

The first memory chips 3101_a to 310n_a and the second memory chips 3101_b to 310n_b may receive an address in common from the memory controller 3300.

The memory controller 3300 may be configured to control the semiconductor memory device 3100. The memory controller 3300 may include a nonvolatile memory 3310. The nonvolatile memory 3310 may store various information needed for operation of the semiconductor memory device 3100.

Each of the first memory chips 3101_a to 310n_a and the second memory chips 3101_b to 310n_b may convert an address received from the memory controller 3300 and operate based on the converted address. Each of the first memory chips 3101_a to 310n_a and the second memory chips 3101_b to 310n_b may convert addresses such that an address of a row of memory cells activated in one chip according to an address received in common from the memory controller 3300 is different from addresses of a row activated in another chip as well as and rows adjacent to the other activated row.

The semiconductor memory device 3100 may form a memory module. The semiconductor memory device 3100 may be integrated in a package to form a multi-chip package. The semiconductor memory device 3100 the memory controller 3300 may be integrated in a package to form a chip-on-chip package. The semiconductor memory device 3100 the memory controller 3300 may form separate packages to form a package-on-package.

As illustrated in FIG. 12 for the embodiment of FIG. 11, for the embodiment of FIG. 13 different scramble information SI may be allocated to the first memory chips 3101_*a* to 310*n*_*a* and the second memory chips 3101_*b* to 310*n*_*b*, respectively. First scramble information may be allocated to the memory chips 3101_*a* to 310*n*_*a* and 3101_*b* to 310*n*_*b* by the rank. Second scramble information may be allocated to the memory chips 3101_*a* to 310*n*_*a*, respectively, and second scramble information may be allocated to the memory chips 3101_*b* to 310*n*_*b*, respectively.

Figure 14:
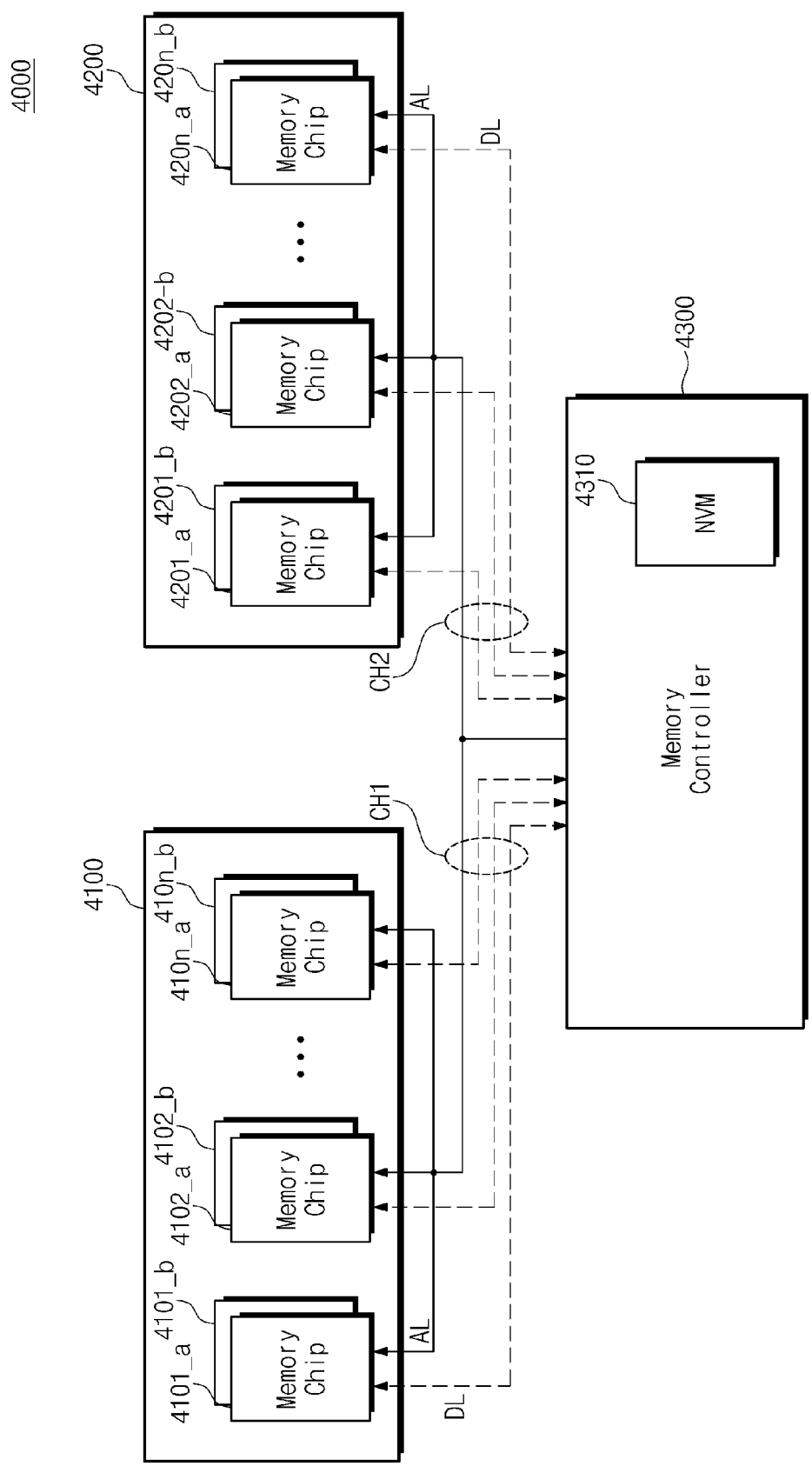
FIG. 14 is a block diagram schematically illustrating aspects of yet another embodiment of a memory system.

FIG. 14 is a block diagram schematically illustrating a memory system 4000 according to yet another embodiment of the inventive concept. Referring to FIG. 14, a memory system 4000 may include first and second semiconductor memory devices 4100 and 4200 and a memory controller 4300.

The first semiconductor memory device 4100 may include first memory chips 4101_*a* to 410*n*_*a* and second memory chips 4101_*b* to 410*n*_*b*.

Each of the first memory chips 4101_*a* to 410*n*_*a* may communicate with the memory controller 4300 through a separate data line DL. The first memory chips 4101_*a* to 410*n*_*a* may communicate with the memory controller 4300 through a common address line AL.

Each of the second memory chips 4101_*b* to 410*n*_*b* may communicate with the memory controller 4300 through a separate data line DL. The second memory chips 4101_*b* to 410*n*_*b* may communicate with the memory controller 4300 through the common address line AL.

The first memory chips 4101_*a* to 410*n*_*a* may form a first rank, and the second memory chips 4101_*b* to 410*n*_*b* may form a second rank. A first memory chip 410*k*_*a* may share the data line DL and the address line AL with a second memory chip 410*k*_*b* corresponding thereto (e.g., chips 4102_*a* and 4102_*b* in device 4100).

The second semiconductor memory device 4200 may include first memory chips 4201_*a* to 420*n*_*a* and second memory chips 4201_*b* to 420*n*_*b*. The first memory chips 4201_*a* to 420*n*_*a* may form a first rank, and the second memory chips 4201_*b* to 420*n*_*b* may form a second rank.

The memory chips 4101_*a* to 410*n*_*a*, 4101_*b* to 410*n*_*b*, 4201_*a* to 420*n*_*a*, and 4201_*b* to 420*n*_*b* may receive an address in common from the memory controller 4300.

The memory controller 4300 may be configured to control the semiconductor memory device 4100. The memory controller 4300 may include a nonvolatile memory 4310. The nonvolatile memory 4310 may store various information needed for an operation of the semiconductor memory device 4100.

Each of the memory chips 4101_*a* to 410*n*_*a*, 4101_*b* to 410*n*_*b*, 4201_*a* to 420*n*_*a*, and 4201_*b* to 420*n*_*b* may convert an address received from the memory controller 4300 and operate based on the converted address. Each of the memory chips 4101_*a* to 410*n*_*a*, 4101_*b* to 410*n*_*b*, 4201_*a* to 420*n*_*a*, and 4201_*b* to 420*n*_*b* may convert addresses such that a row activated at an address of a row of memory cells according to an address received in common from the memory controller 4300 is different from other rows activated in the other chips as well as different from rows adjacent to the other activated rows.

The semiconductor memory device 4100 may form a memory module. The semiconductor memory device 4100 may be integrated in a package to form a multi-chip package. The semiconductor memory device 4200 may form a memory module. The semiconductor memory device 4200 may be integrated in a package to form a multi-chip package. The semiconductor memory devices 4100 and 4200 may be integrated in a package to form a chip multi-chip package.

The semiconductor memory devices 4100 and 4200 and the memory controller 4300 may be integrated in a package to form a chip-on-chip package. The semiconductor memory devices 4100 and 4200 and the memory controller 4300 may form separate packages to form a package-on-package.

The memory system 4000 in FIG. 14 may be a hybrid combination of a memory system 2000 in FIG. 11 and a memory system 3000 in FIG. 13. The memory system 4000 may have multiple channels, each of which has multiple ranks. For example, in FIG. 14, there is illustrated an example where the memory system 4000 is implemented such that the same number of ranks is provided every channel. However, it is well understood that the memory system 4000 may be modified such that rank numbers of respective channels are different from one another.

FIG. 15 is a table schematically illustrating memory chips 4101_*a* to 410*n*_*a*, 4101_*b* to 410*n*_*b*, 4201_*a* to 420*n*_*a*, and 4201_*b* to 420*n*_*b* and scramble information SI corresponding thereto. Referring to FIGS. 14 and 15, scramble information SI_a may be allocated to memory chips 4101_*a* to 410*n*_*a* and 4101_*b* to 410*n*_*b*, and scramble information SI_b may be allocated to memory chips 4201_*a* to 420*n*_*a* and 4201_*b* to 420*n*_*b*. Different scramble information SI_a and SI_b may be allocated to the memory chips 4101_*a* to 410*n*_*a*, 4101_*b* to 410*n*_*b*, 4201_*a* to 420*n*_*a*, and 4201_*b* to 420*n*_*b* by the channel. The first scramble information SI_a and SI_b may be different from each other.

In a first channel, second scramble information SI_R1 may be allocated to the memory chips 4101_*a* to 410*n*_*a*, and second scramble information SI_R2 may be allocated to the memory chips 4101_*b* to 410*n*_*b*. In a second channel, the second scramble information SI_R1 may be allocated to the memory chips 4201_*a* to 420*n*_*a*, and the second scramble information SI_R2 may be allocated to the memory chips 4201_*b* to 420*n*_*b*. That is, different scramble information SI_R1 and SI_R2 may be allocated to the memory chips 4101_*a* to 410*n*_*a*, 4101_*b* to 410*n*_*b*, 4201_*a* to 420*n*_*a*, and 4201_*b* to 420*n*_*b* by the rank. The second scramble information SI_R1 and SI_R2 may be different from each other.

In a first rank RANK1 of the first channel CH1, third scramble information SI_1 to SI_n may be allocated to the memory chips 4101_*a* to 410*n*_*a*. In a second rank RANK2 of the first channel CH1, third scramble information SI_1 and SI_2 may be allocated to the memory chips 4101_*b* to 410*n*_*b*, respectively. In a first rank RANK1 of the second channel CH2, third scramble information SI_1 to SI_n may be allocated to the memory chips 4201_*a* to 420*n*_*a*. In a second rank RANK2 of the second channel CH2, third scramble information SI_1 and SI_2 may be allocated to the memory chips 4201_*b* to 420*n*_*b*, respectively.

The third scramble information SI_1 to SI_n may be different from one another. Each of the memory chips 4101_*a* to 410*n*_*a*, 4101_*b* to 410*n*_*b*, 4201_*a* to 420*n*_*a*, and 4201_*b* to 420*n*_*b* may convert addresses based on a combination of the first to third scramble information allocated thereto. That is, the memory chips 4101_*a* to 410*n*_*a*, 4101_b to 410n_b, 4201_a to 420n_a, and 4201_b to 420n_b may make convert addresses based on different scramble information SI.

For example, the memory chips 4101_a to 410n_a may combine the first to third scramble information to generate scramble information SI_aR11 to SI_aR1n. The memory chips 4101_b to 410n_b may combine the first to third scramble information to generate scramble information SI_aR21 to SI_aR2n. The memory chips 4201_a to 420n_a may combine the first to third scramble information to generate scramble information SI_bR11 to SI_bR1n. The memory chips 4201_b to 420n_b may combine the first to third scramble information to generate scramble information SI_bR21 to SI_bR2n.

The scramble information SI_aR11 to SI_aR1n, SI_aR21 to SI_aR2n, SI_bR11 to SI_bR1n, and SI_bR21 to SI_bR2n may include different address conversion tables or different address conversion rules. When rows (or, word lines) of memory cells in the memory chips 4101_a to 410n_a, 4101_b to 410n_b, 4201_a to 420n_a, and 4201_b to 420n_b are selected by the same address ADDR1, the scramble information SI_aR11 to SI_aR1n, SI_aR21 to SI_aR2n, SI_bR11 to SI_bR1n, SI_bR21 to SI_bR2n may be set such that addresses of victim word lines in the memory chips 4101_a to 410n_a, 4101_b to 410n_b, 4201_a to 420n_a, and 4201_b to 420n_b are different from one another.

Figure 16:
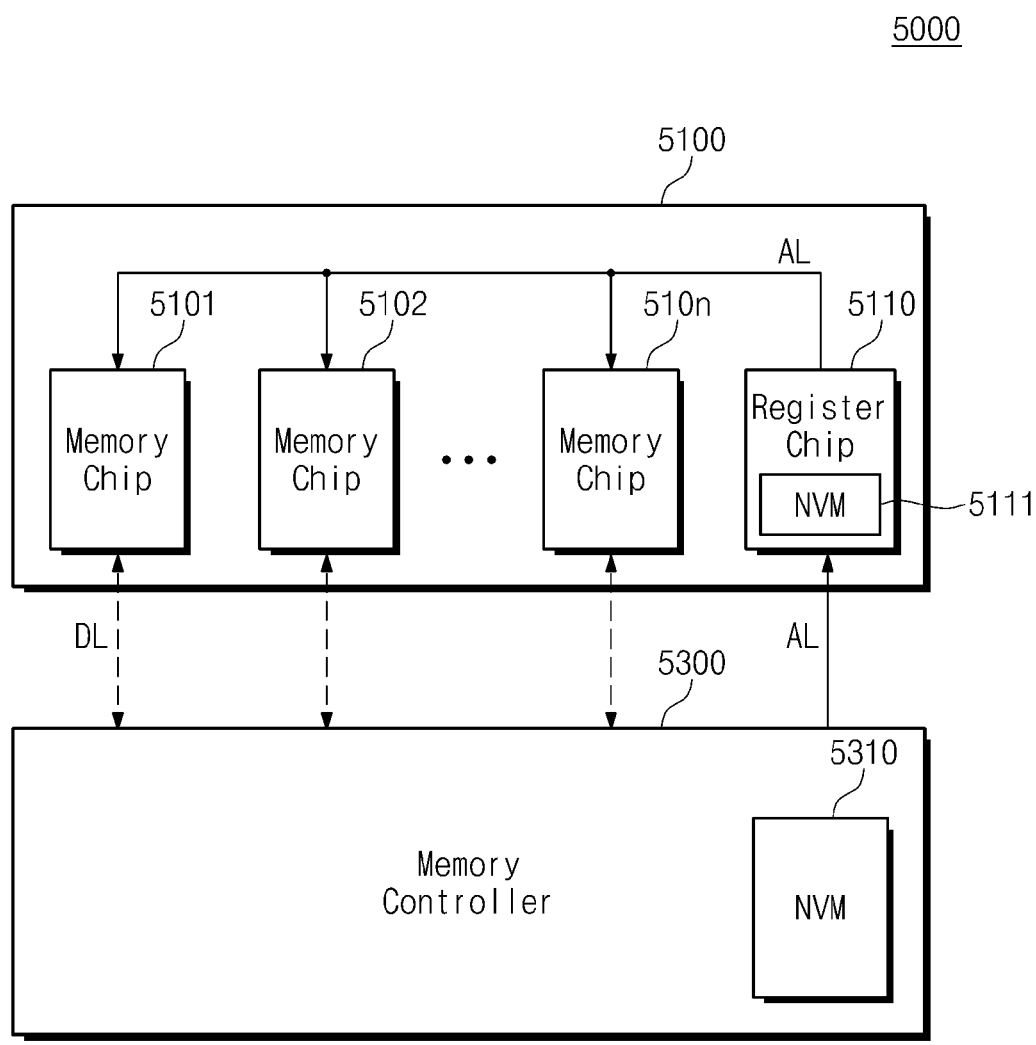
FIG. 16 is a block diagram schematically illustrating aspects of a further embodiment of a memory system.

FIG. 16 is a block diagram schematically illustrating a memory system 5000 according to a further embodiment of the inventive concept. Referring to FIG. 16, a memory system 5000 may include a semiconductor memory device 5100 and a memory controller 5300.

The semiconductor memory device 5100 may include memory chips 5101 to 510n and a register chip 5110. The register chip 5110 may receive an address through an address line AL from the memory controller 5300. The register chip 5110 may transfer the input address to the memory chips 5101 to 510n.

The memory chips 5101 to 510n may communicate with the memory controller 5300 through separate data lines DL. The memory chips 5101 to 510n may communicate with the register chip 5110 through a common address line AL.

The memory system 5000 may operate in a similar manner under the same structure as that 1000 described with reference to FIG. 1 except primarily that the register chip 5110 is provided. Each of the memory chips 5101 to 510n may convert an address received from the register chip 5110.

Scramble information SI may be transferred to the memory chips 5101 to 510n through the register chip 5110 from the memory controller 5300. The register chip 5110 may store the scramble information SI in a nonvolatile memory 5111. At power-on, the register chip 5110 may send the scramble information SI to the memory chips 5101 to 510n.

The memory system 5000 may be implemented to have a multi-channel or multi-bank structure as described with reference to FIGS. 11 to 15.

Figure 17:
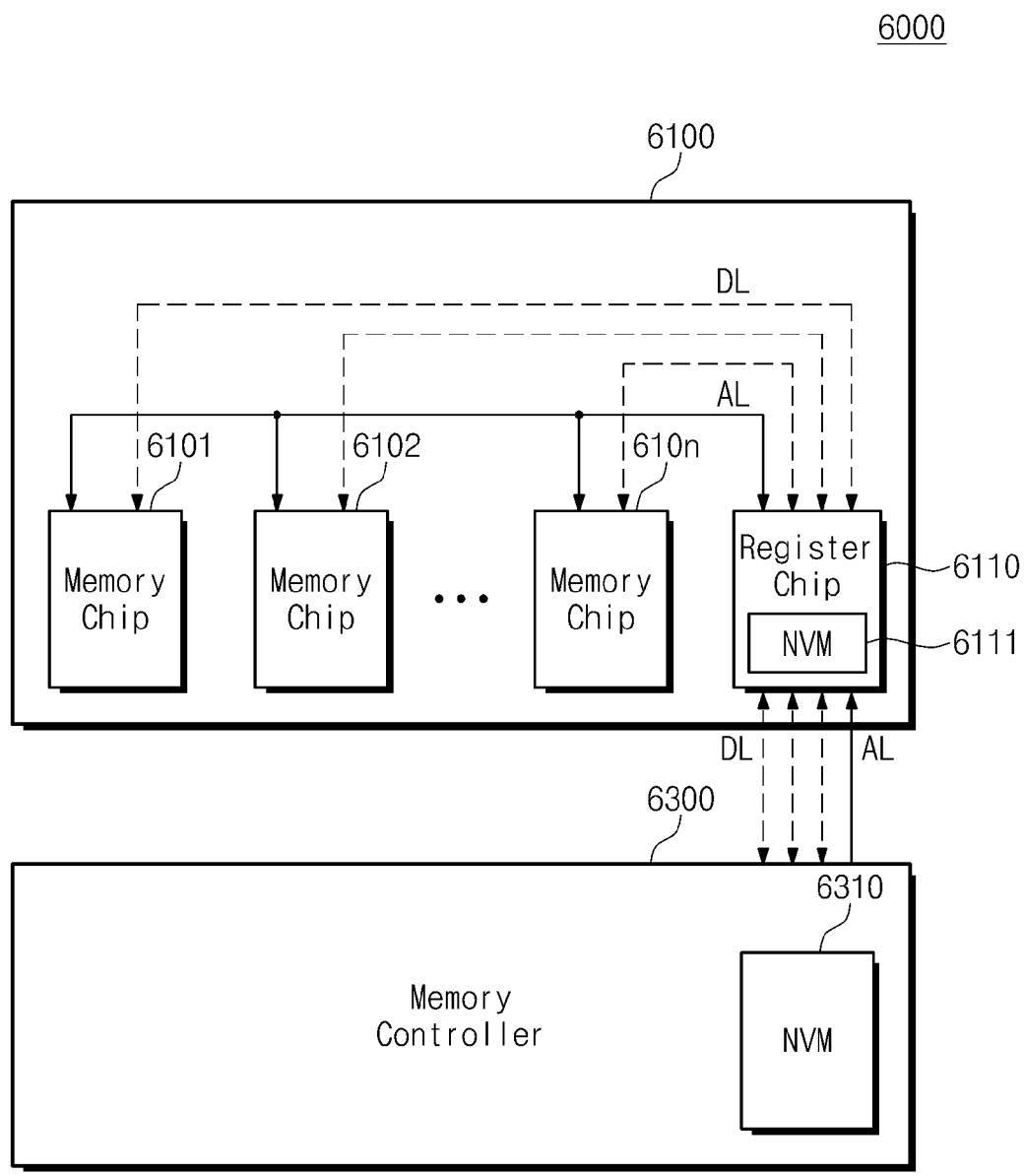
FIG. 17 is a block diagram schematically illustrating aspects of yet another embodiment of a memory system.

FIG. 17 is a block diagram schematically illustrating a memory system 6000 according to another embodiment of the inventive concept. Referring to FIG. 17, a memory system 6000 may include a semiconductor memory device 6100 and a memory controller 6300.

The semiconductor memory device 6100 may include memory chips 6101 to 610n and a register chip 6110. The register chip 6110 may receive an address through an address line AL from the memory controller 6300. The register chip 6110 may exchange data with the memory controller 6300 through a data line DL. The register chip 6110 may transfer the input address to the memory chips 6101 to 610n. The register chip 6110 may exchange data with the memory chips 6101 to 610n which is exchanged with the memory controller 6300.

The memory chips memory chips 6101 to 610n may communicate with the register chip 6110 through separate data lines DL. The memory chips memory chips 6101 to 610n may communicate with the register chip 6110 through a common address line AL.

The memory system 6000 may operate in a similar manner under the same structure as that 1000 described with reference to FIG. 1 except that, for one thing, the register chip 6110 is provided. Each of the memory chips 6101 to 610n may convert an address received from the register chip 6110.

Scramble information SI may be transferred to the memory chips 6101 to 610n through the register chip 6110 from the memory controller 6300. The register chip 6110 may store the scramble information SI in a nonvolatile memory 6111. At power-on, the register chip 6110 may send the scramble information SI to the memory chips 6101 to 610n.

The memory system 6000 may be implemented to have a multi-channel or multi-bank structure as described with reference to FIGS. 11 to 15.

Figure 18:
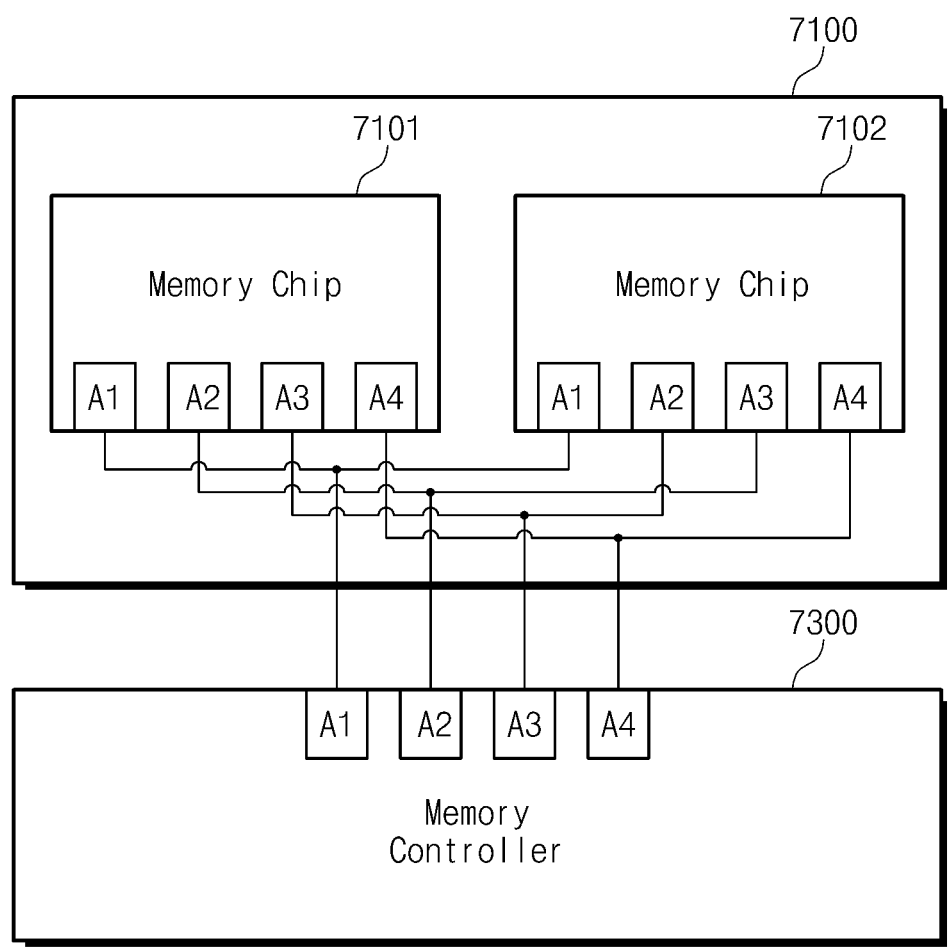
FIG. 18 is a block diagram schematically illustrating aspects of yet still another embodiment of a memory system.

FIG. 18 is a block diagram schematically illustrating a memory system 7000 according to still another embodiment of the inventive concept. Referring to FIG. 18, a memory system 7000 may include a semiconductor memory device 7100 and a memory controller 7300.

The semiconductor memory device 7100 may include first and second memory chips 7101 and 7102. The first memory chip 7101 may include address nodes A1 to A4. The second memory chip 7102 may include address nodes A1 to A4. Each of the first and second memory chips 7101 and 7102 may receive an address through the address nodes A1 to A4 from the memory controller 7300.

The memory controller 7300 may include address nodes A1 to A4. The memory controller 7300 may output an address through the address nodes A1 to A4.

In FIG. 18, there is illustrated an example where a data line between the first and second memory chips 7101 and 7102 and the memory controller 7300 is skipped.

An address node of the memory controller 7300 may be connected with different address nodes of the first and second memory chips 7101 and 7102. For example, an address node A1 of the memory controller 7300 may be connected with address nodes A1 of the first and second memory chips 7101 and 7102, and an address node A4 of the memory controller 7300 may be connected with address nodes A4 of the first and second memory chips 7101 and 7102. On the other hand, an address node A2 of the memory controller 7300 may be connected with an address node A2 of the first memory chip 7101 and an address node A3 of the second memory chip 7102. Also, an address node A3 of the memory controller 7300 may be connected with an address node A3 of the first memory chip 7101 and an address node A2 of the second memory chip 7102.

That is, address lines AL between the first and second memory chips 7101 and 7102 and the memory controller 7300 may be scrambled. Although the memory controller 7300 outputs the same address through the address nodes A1 to A4, an address provided to the first memory chip 7101 through corresponding address nodes A1 to A4 may be different from an address provided to the second memory chip 7102 through corresponding address nodes A1 to A4.

For example, when rows (or, word lines) of memory cells in the memory chips 7101 to 7102 are selected by the same address output from the memory controller 7300, the address lines AL may be scrambled such that addresses of victim word lines in the memory chips 7101 to 7102 are different from one another.

FIG. 19 is a table schematically illustrating an address line scrambling method according to an embodiment of the inventive concept. Referring to FIG. 19, a memory controller may have first to third address nodes A1 to A3.

The address nodes A1 to A3 of the memory controller may be connected with address nodes A1 to A3 of a first memory chip MC1, respectively. The address nodes A1, A2, and A3 of the memory controller may be connected with address nodes A1, A3, and A2 of a second memory chip MC2, respectively. The address nodes A1, A2, and A3 of the memory controller may be connected with address nodes A2, A1, and A3 of a third memory chip MC3, respectively. The address nodes A1, A2, and A3 of the memory controller may be connected with address nodes A2, A3, and A1 of a fourth memory chip MC4, respectively. The address nodes A1, A2, and A3 of the memory controller may be connected with address nodes A3, A1, and A2 of a fifth memory chip MC5, respectively. The address nodes A1, A2, and A3 of the memory controller may be connected with address nodes A3, A2, and A1 of a sixth memory chip MC6, respectively.

Figure 20:
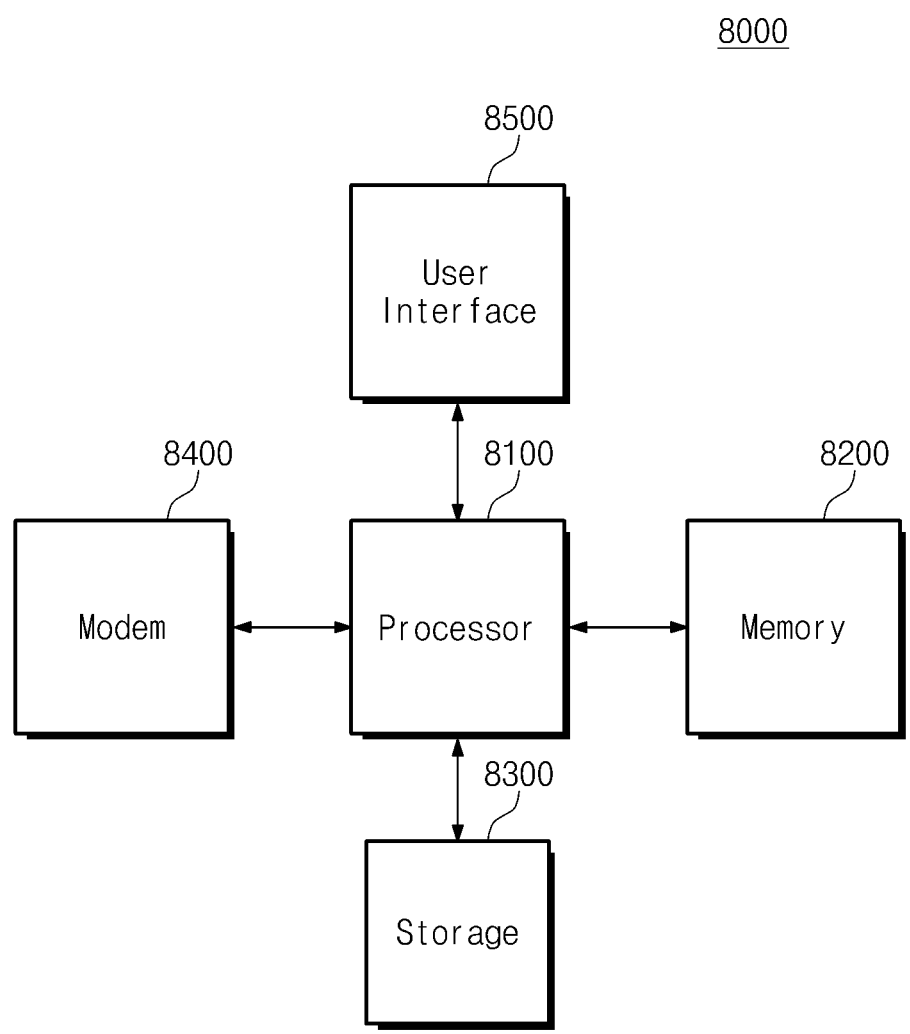
FIG. 20 is a block diagram schematically illustrating an exemplary computing apparatus for use with embodiments of memory systems and chips of the preceding figures.

FIG. 20 is a block diagram schematically illustrating a computing apparatus 8000 according to an embodiment of the inventive concept. Referring to FIG. 20, a computing apparatus 8000 may include a processor 8100, a memory 8200, storage 8300, a modem 8400, and a user interface 8500.

The processor 8100 may control an overall operation of the computing apparatus 8000. The processor 8100 may, for example, be formed as part of a system-on-chip (SoC). The processor 8100 may be a general purpose processor or an application processor.

The memory 8200 communicates with the processor 8100. The memory 8200 may be a working memory of the processor 8100 or the computing apparatus 8000. The memory 8200 may include volatile memory such as static RAM, dynamic RAM, synchronous DRAM, or the like or nonvolatile memory such as flash memory, phase-change RAM (PRAM), magnetic RAM (MRAM), resistive RAM (RRAM), ferroelectric RAM (FRAM), or the like.

The memory 8200 may include semiconductor memory chips and systems as described with reference to FIGS. 1 to 19. The memory 8200 may include at least one semiconductor memory chip which is configured to convert an address received from the processor 8100.

The memory 8200 may include at least one memory module or at least on memory package.

The storage 8300 may store data which the computing apparatus 8000 retains for a long time. The storage 8300 may include a hard disk drive or nonvolatile memory such as flash memory, phase-change RAM (PRAM), magnetic RAM (MRAM), resistive RAM (RRAM), ferroelectric RAM (FRAM), or the like.

Exemplarily, the memory 8200 and the storage 8300 may be formed of the same type of nonvolatile memory. In this case, the memory 8200 and the storage 8300 may be integrated in a semiconductor integrated circuit or as part of a package or module.

The modem 8400 may communicate with an external device under control of the processor 8100. For example, the modem 8400 may communicate with external devices in a wired or wireless manner. The modem 8400 may communicate based on various wireless communications schemes such as LTE (Long Term Evolution), WiMax, GSM (Global System for Mobile communication), CDMA (Code Division Multiple Access), Bluetooth, NFC (Near Field Communication), WiFi, RFID (Radio Frequency Identification, and so on, or wireline communications techniques such as USB (Universal Serial Bus), SATA (Serial AT Attachment), SCSI (Small Computer Small Interface), Firewire, PCI (Peripheral Component Interconnection), and so on.

The user interface 8500 may communicate with a user according to a control of the processor 8100. For example, the user interface 8500 may include user input interfaces such as a keyboard, a keypad, buttons, a touch panel, a touch screen, a touch pad, a touch ball, a camera, a microphone, a gyroscope sensor, a vibration sensor, and so on. The user interface 8500 may further include user output interfaces such as an LCD, an OLED (Organic Light Emitting Diode) display device, an AMOLED (Active Matrix OLED) display device, an LED, a speaker, a motor, and so on.

Memories and memory systems as described above as well as computing apparatuses that incorporate such memories and memory systems can provide for improved operation for a wide variety of applications. While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A memory system, comprising:

first and second semiconductor memories each including a plurality of memory cells disposed along rows and columns, each row in a first plurality of memory cells of the first semiconductor memory having a corresponding row having a same location in a second plurality of memory cells of the second semiconductor memory; and a memory controller coupled to the first and second semiconductor memories and configured to provide a common address, first group scramble information, first chip scramble information, and second chip scramble information to the first and second semiconductor memories, wherein the first semiconductor memory is configured to access a first row of memory cells in the first semiconductor memory based on the common address, the first group scramble information and the first chip scramble information, and the second semiconductor memory is configured to access a second row of memory cells in the second semiconductor memory based on the common address, the first group scramble information and the second chip scramble information, wherein a first location of the first row in the first semiconductor memory is different from a second location of the second row in the second semiconductor memory, wherein row addresses of rows adjacent to the first row of memory cells in the first semiconductor memory are different from row addresses of rows in the first plurality of memory cells of the first semiconductor memory that correspond to rows in the second plurality of memory cells of the second semiconductor memory adjacent to the second row of memory cells of the second semiconductor memory, wherein the memory system further comprises third and fourth semiconductor memories configured to receive a second common address, second group scramble information, the first chip scramble information, and the second chip scramble information from the memory controller, wherein the third semiconductor memory is configured to access a third row based on the second common address, the second group scramble information and the first chip scramble information, and the fourth semiconductor memory is configured to access a fourth row based on the second common address, the second group scramble information and the second chip scramble information, and wherein a third location of the third row is different from the first location when the second common address is identical to the common address, and a fourth location of the fourth row is different from the third location.

2. The memory system of claim 1, wherein the first to fourth semiconductor memories include the same structure for their respective pluralities of memory cells.

3. The memory system of claim 1, wherein the first semiconductor memory is configured to convert the common address to a first address and the second semiconductor memory is configured to convert the common address to a second address.

4. The memory system of claim 3, wherein each of the first and second semiconductor memories comprises:
an address buffer configured to store the common address;
a program circuit configured to provide the first group scramble information and at least one of the first chip scramble information and the second chip scramble information; and
an address converter configured to convert the common address stored in the address buffer to the respective first or second address according to the first group scramble information and one of the first chip scramble information and the second chip scramble information.

5. The memory system of claim 4, wherein the first chip scramble information for the first semiconductor memory is different from the second chip scramble information for the second semiconductor memory.

6. The memory system of claim 4, wherein the program circuit includes a fuse circuit or a mode register.

7. The memory system of claim 4, wherein the memory controller is configured to transfer the first group scramble information to the first and second semiconductor memories at power-on.

8. The memory system of claim 1, further comprising:
fifth and sixth semiconductor memories configured to receive the common address from the memory controller and each including a plurality of memory cells disposed along rows and columns, each row in a third and a fourth plurality of memory cells of the fifth and sixth semiconductor memories, respectively, having a corresponding row having a same location in the first plurality of memory cells and a corresponding row in the second plurality of memory cells,
wherein the fifth semiconductor memory is configured to access a fifth row of memory cells in the fifth semiconductor memory based on the common address, the first group scramble information and third chip scramble information, and the sixth semiconductor memory is configured to access a sixth row of memory cells in the sixth semiconductor memory based on the common address, the first group scramble information and fourth chip scramble information, and
wherein locations of the first, second, fifth, and sixth rows are different from each other.

9. The memory system of claim 8, wherein a third address of the third row is different from an address of a row in the third semiconductor memory that corresponds to the first row and from an address of a row in the third semiconductor memory that corresponds to the second row.

10. The memory system of claim 8, wherein the first, second, fifth, and sixth semiconductor memories form a first memory module configured to communicate with the memory controller through a first channel and the third and fourth semiconductor memories form a second memory module configured to communicate with the memory controller through a second channel.

11. The memory system of claim 1, further comprising a register block configured to receive the common address from the memory controller, to transfer the received address to the first and second semiconductor memories, and to write scramble information to the first and second semiconductor memories at power-on.

12. The memory system of claim 1, wherein a first address node of the memory controller is connected to a first address node of the first semiconductor memory and to a second address node of the second semiconductor memory.

13. The memory system of claim 1, wherein the first and second semiconductor memories form a first memory module sharing a first common address and data channel, and the third and fourth semiconductor memories form a second memory module sharing a second common address and data channel, the second common address and data channel being different from the first common address and data channel.

14. The memory system of claim 1, wherein the first and second semiconductor memories form a first rank sharing a common address and data channel, and the third and fourth semiconductor memories form a second rank sharing the common address and data channel.

15. A computing apparatus comprising:
a processor;
a memory controller coupled to the processor; and
first and second memories coupled to the memory controller to receive a common input address, each memory including a plurality of memory cells disposed along rows and columns, each row in a first plurality of memory cells in the first memory having a corresponding row in a second plurality of memory cells in the second memory,
wherein the computing apparatus is configured to convert the common input address into a first row address for a first row in the first memory based on first group scramble information and first chip scramble information and a second row address for a second row in the second memory based on the first group scramble information and second chip scramble information, the first row address being different from a third row address of a third row in the first memory that corresponds to the second row in the second memory,
wherein the computing apparatus further comprises third and fourth memories receiving a second common input address from the memory controller,
wherein the computing apparatus converts the second common input address into a fourth row address for a fourth row in the third memory based on second group scramble information and the first chip scramble information, the first row address being different from a fifth row address of a fifth row in the first memory that corresponds to the fourth row in the third memory, and
wherein the computing apparatus converts the second common input address into a sixth row address for the sixth row in the fourth memory based on the second group scramble information and the second chip scramble information, the fourth row address being different from a seventh row address of a seventh row in the fourth memory that corresponds to the sixth row in the fourth memory.

16. The computing apparatus of claim 15, wherein the computing apparatus is configured to use the first group scramble information and one of the first chip scramble information and the second chip scramble information to convert the common input address into the first and second row addresses.

17. The computing apparatus of claim 16, further comprising fifth and sixth memories coupled to the memory controller to receive the common input address, the fifth and sixth memories each including a plurality of memory cells disposed along rows and columns, each row in the fifth and sixth plurality of memory cells having a corresponding row in the first plurality of memory cells, and wherein the computing apparatus is configured to use the scramble information to convert the common input address into an eighth row address for an eighth row in the fifth memory and a ninth row address for a ninth row in the sixth memory, the eighth row address being different from a tenth row address of a tenth row in the fifth memory that corresponds to the first row in the first memory, different from an eleventh row address of an eleventh row in the fifth memory that corresponds to the second row in the second memory.

* * * * *